United States Patent [19]

Bianchi

[11] Patent Number: 4,659,985
[45] Date of Patent: Apr. 21, 1987

[54] ELECTRIC METER HAVING AT LEAST TWO DISPLAY REGISTERS SELECTED ACCORDING TO A PARAMETER

[75] Inventor: Julio J. Bianchi, Lanus Oeste, Argentina

[73] Assignee: General Electric Company, Somersworth, N.H.

[21] Appl. No.: 675,433

[22] Filed: Nov. 27, 1984

[30] Foreign Application Priority Data

Dec. 15, 1983 [AR] Argentina ............................ 295133

[51] Int. Cl.⁴ ...................... G01R 11/57; G01R 11/63
[52] U.S. Cl. .................................................. 324/116
[58] Field of Search ............... 324/116, 138, 114, 115; 364/483

[56] References Cited

U.S. PATENT DOCUMENTS

| | | | |
|---|---|---|---|
| 2,037,447 | 4/1936 | Wenk | 324/116 |
| 3,683,343 | 8/1972 | Feldman et al. | 324/116 X |
| 4,081,746 | 3/1978 | Snyder et al. | 324/116 |
| 4,128,807 | 12/1978 | Halstead et al. | 324/116 |
| 4,166,975 | 9/1979 | Germer et al. | 324/116 |
| 4,199,717 | 4/1980 | Germer et al. | 324/116 |
| 4,365,194 | 12/1982 | Halstead et al. | 324/116 |

Primary Examiner—Reinhard J. Eisenzopf
Assistant Examiner—Stephen M. Baker
Attorney, Agent, or Firm—Robert E. Brunson; Thomas R. Morrison

[57] ABSTRACT

An electric watthour meter provides for selectively accumulating energy consumption in one of at least two registers according to the value of a parameter relative to a predetermined threshold level. The parameter may be a load current, a line voltage, a time of day or a combination thereof.

3 Claims, 6 Drawing Figures

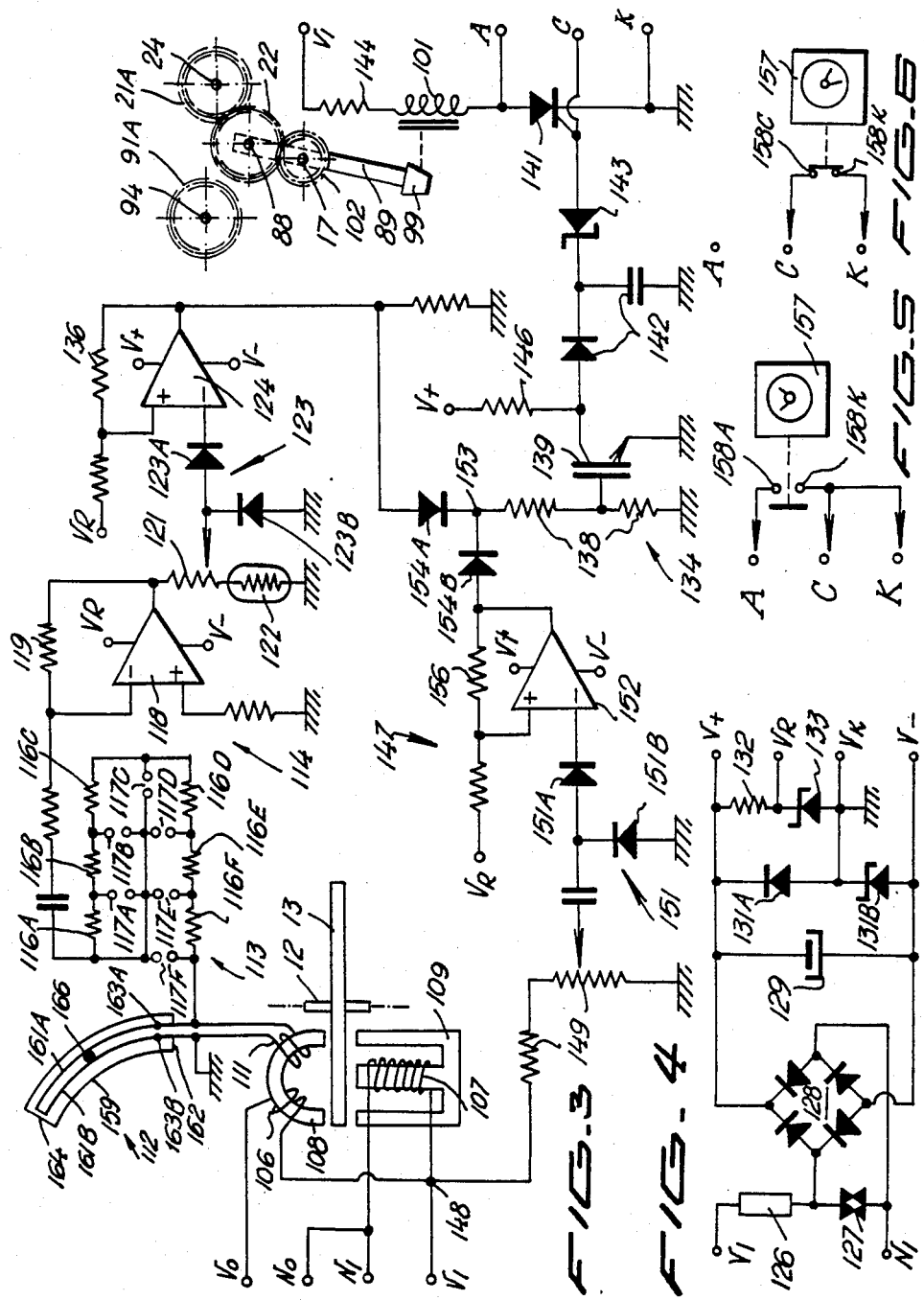

4,659,985

ELECTRIC METER HAVING AT LEAST TWO DISPLAY REGISTERS SELECTED ACCORDING TO A PARAMETER

BACKGROUND OF THE INVENTION

The present invention relates to electric meters and, more specifically, to registers for electric meters.

When an electric utility operates near the upper limit of its power-generating capacity, it is valuable to find a way to limit the total power consumption of its customers during peak hours in order to avoid overloading its generator system. Utilities attempt to accomplish such limiting by applying a higher tariff for high level of consumption during peak times.

Many rate-setting bodies permit the electric utility to use multitariff systems in which a higher tariff is applied to the energy consumed at an excessive rate, or at certain times, or at combinations of these parameters. In order to implement a multitariff system, an electric meter must include means for recording power usage at a higher rate under the defined conditions. A current threshold above which a higher tariff applies in a 220-volt single-phase system may be selected from, for example, 15, 18, 24, 30, 36, and 45 amperes according to the consumer's prior usage. Below the threshold, the normal tariff is applied. Above about 45 amperes (equivalent to 14 KVA in a 220 volt, 50 Hertz, network), a three-phase system may be preferred.

In the prior art, such differential tariffs are accomplished with demand registers in which the energy usage is totalled over each of a series of fixed demand intervals. A typical demand register is disclosed in U.S. Pat. No. 3,586,974. According to the referenced patent, if the energy usage in any one demand interval exceeds a threshold value over a period between meter readings, the higher of two tariffs is applied. Although effective in limiting peaks in energy usage, a demand register, integrating energy usage over fixed demand intervals, tends to average out usage peaks and weakens the incentive for limiting instantaneous demand. In addition, conventional demand registers are not equipped to apply the higher tariff, or ignore it, depending on the time of day.

In order to implement some multitariff systems, a utility requires an electric meter of a type including means for separating and separately accumulating the energy usage according to the instantaneous power level at which such usage occurs and/or according to the time of day. The threshold should preferably be relatively simply changed by the utility and should be relatively difficult for the consumer to modify.

OBJECTS AND SUMMARY OF THE INVENTION

Accordingly, it is an object of invention to provide two registers for an electric meter including means responsive to at least one parameter for selectively registering a measurement of electric usage in separate ones of the two registers.

It is a further object of the present invention to provide an electric meter having two display registers, one of the registers for metering electric consumption when the parameter is below a threshold, and the other of the registers for metering electric consumption when the parameter exceeds the threshold.

It is a still further object of the invention to provide an electrical meter including means for separately accumulating the energy consumed at rates above and below a predetermined level.

It is a still further object of the invention to provide a clock for controlling accumulation of electric energy in the two registers in dependence on the time of day.

Another particular object of the present invention is to provide a meter wherein the means for changing the threshold is inaccessible to the consumer and is easily accessible to the utility.

It is a still further object of the invention to provide an indication to the energy consumer that the threshold is being exceeded.

Briefly stated the present invention provides for selectively accumulating energy consumption in one of at least two registers according to the value of a parameter relative to a predetermined threshold. The parameter may be a load current, a line voltage, a time of day, or a combination thereof.

According to an embodiment of the invention, there is provided an electric meter comprising a sensor disk, means for driving said sensor disk at a speed proportional to a current consumed by a load, a main register, an auxiliary register, means for sensing a parameter and means for drivably connecting said sensor disk to said main register under a first condition of said parameter and for drivably connecting said sensor disk to said auxiliary register under a second different condition of said parameter whereby separate accumulation of energy usage is provided.

The above, and other objects, features and advantages of the present invention will become apparent from the following description read in conjunction with the accompanying drawings, in which like reference numerals designate the same elements.

BRIEF DESCRIPTION OF THE DRAWINGS

FIG. 3 is a schematic diagram of an electronic circuit for use with the electric meter of FIGS. 1 and 2.

FIG. 4 is a schematic diagram of a power supply for the electronic circuit of FIG. 3.

FIG. 5 is a schematic diagram of a first clock control for use with the circuit of FIG. 3.

FIG. 6 is a schematic diagram of a second clock control for use with the circuit of FIG. 3.

DETAILED DESCRIPTION OF THE INVENTION

Figure 1:
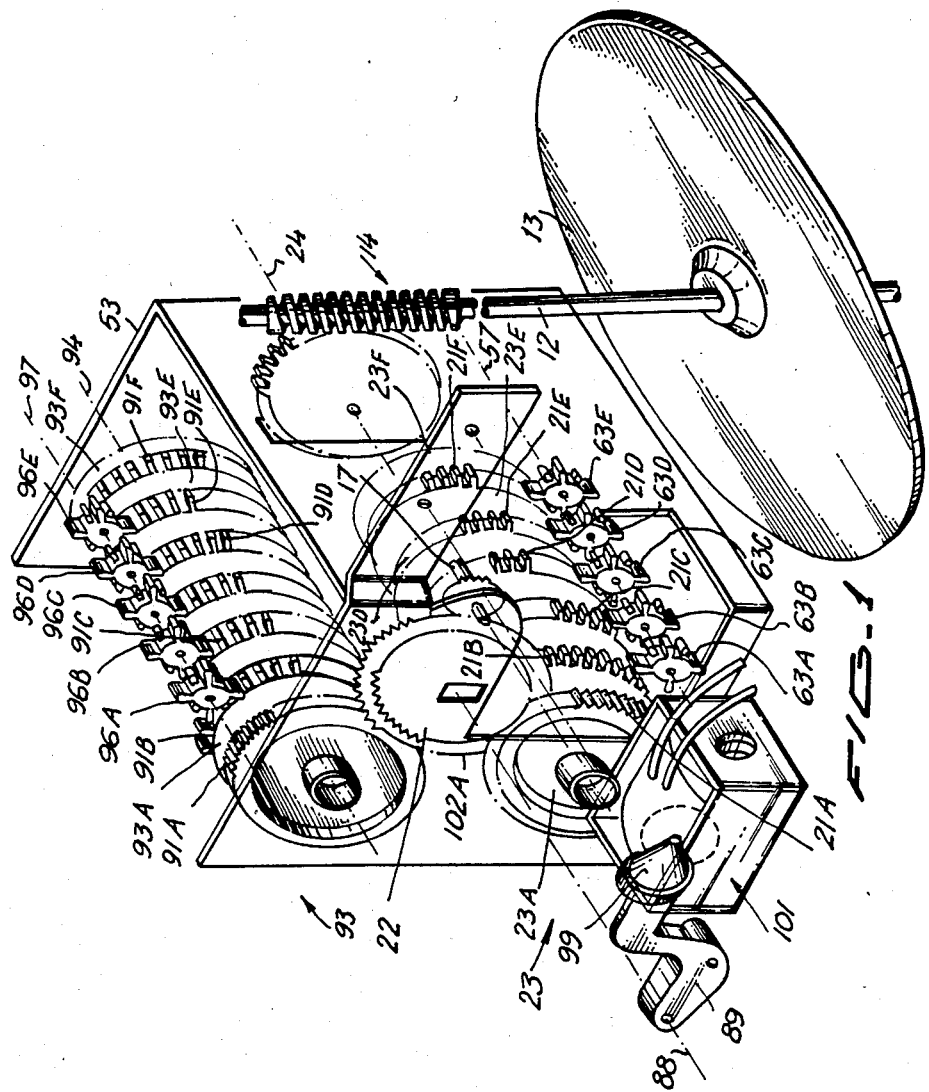
FIG. 1 is a partial perspective view of an electric meter according to an embodiment of the invention.
Figure 2:
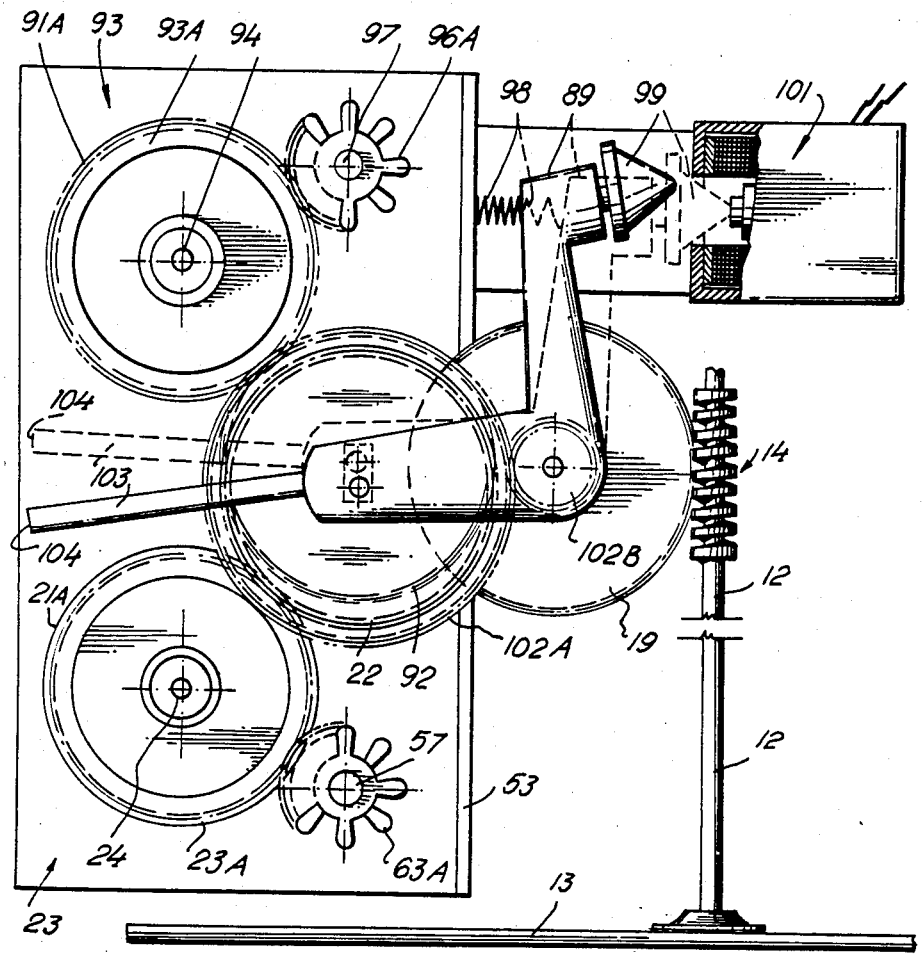
FIG. 2 is a transverse cross-section of the electric meter of FIG. 1, showing the relative movement of components thereof.

Referring to FIGS. 1 and 2, a dual-rate, watt-hour meter, shown generally at 10, includes a shaft 12 rotated by a sensor disk 13 which is driven by interaction with electromagnetic fields of conventional voltage and current coils (not shown in FIGS. 1 and 2). The angular velocity of sensor disk 13 is proportional to the product of the voltage and the current; that is, the power consumed by the load. The number of turns executed by sensor disk 13 is proportional to the total energy consumed by the load.

A worm 14 transmits the movement of sensor disk 13 to a worm wheel 19 which rotates a shaft 17 rigidly affixed thereto. Shaft 17 is preferably of brass and worm wheel 19 is preferably of aluminum having 100 teeth and a pitch diameter of 130.9 mm (approximately 5 5/32").

When the rate of energy consumption remains below a threshold, dual rate watt-hour meter 10 transmits rotary movement through a change gear 22, which is affixed to shaft 17, to a gear 21A. The total amount of energy consumed by the load under such conditions, is displayed on a main register 23. Main register 23 consists of main register cyclometer drums 23A, 23B, 23C, 23D, 23E and 23F freely disposed for rotation on a main register drum shaft 24. Gear 21A is rigidly affixed to main register cyclometer drum 23A. Each main register cyclometer drum 23A, 23B, 23C, 23D, 23E and 23F includes a sequence of decimal digits (not shown) marked thereon which are individually brought into position for reading. The digits on main register cyclometer drum 23A represent the least significant digits of main register 23 and may be, for example, tenths of kilowatt hours. Other applications may require a different value for the least significant digit but such changes would not cause the apparatus disclosed herein to fall outside the scope of the invention. In addition, although the remainder of the invention is described in relation to a specific embodiment using cyclometer-type indicating devices, it would be clear to one skilled in the art that the invention is equally applicable to electric meters including other indicating devices such as, for example, dial-type or electronic digital-type indicating devices.

Main register 23 is mounted in a frame 53 which is preferably made of an insulating material such as, for example, a polycarbonate material such as one sold under the trademark Rislane 11. Frame 53 supports a pinion shaft 57, whose axis is indicated by a dashed line, on which a series 63 of pinions 63A, 63B, 63C, 63D and 63E are mounted. As an immediately lower order one of main register cyclometer drums 23A, 23B, 23C, 23D and 23E changes from 9 to 0, the associated one of pinions 63A, 63B, 63C, 63D and 63E indexes the next higher main register cyclometer drum 23B, 23C, 23D, 23E and 23F one digit higher. Each one of the higher order main register cyclometer drums 23B, 23C, 23D, 23E and 23F (i.e. all of the cyclometer drums in main register 23 except main register cyclometer drum 23A) has a respective one of gears 21B, 21C, 21D, 21E and 21F rigidly affixed thereto and engaging a corresponding one of pinions 63A, 63B, 63C, 63D and 63E for performing a conventional carry operation.

Change gear 22 is mounted on an axle 88 which is, in turn, mounted on a rocker arm 80. Rocker arm 89 is rotatably mounted on shaft 17 to enable displacement of change gear 22 is an arc sufficiently wide to disengage it from gear 21A, and to move it into a position 92, indicated in dashed lines (FIG. 2), in which it engages a gear 91A of an auxiliary register 93.

When the consumption of current exceeds a predetermined value, dual rate watt-hour meter 10 shifts from a normal storage of usage data to a special, or auxiliary mode, in which change gear 22 is displaced to position 92, in a manner described hereinafter. In the special mode, the amount of energy consumed is accumulated in, and indicated on, auxiliary register 93. Auxiliary register 93 includes auxiliary register cyclometer drums 93A, 93B, 93C, 93D, 93E and 93F freely rotatable upon an auxiliary register drum shaft 94. Auxiliary register 93 further includes a set 96 of pinions 96A, 96B, 96C, 96D, and 96E upon a pinion shaft 97 to perform the carry operation on respective gears 91B, 91C, 91D, 91E and 91F. Main register drum shaft 24 and auxiliary register drum shaft 94 are preferably of stainless steel having a diameter of about 1 mm (approximately 1/25") and a length of about 95 mm (approximately 3¾").

Referring specifically to FIG. 2, the rotation of rocker arm 89 about shaft 17 is controlled by a spring 98 and a mass of ferromagnetic material 99 under the influence of a magnetic field generated by an electromagnet 101. Electromagnet 101 includes a coil 101A which attracts mass of ferromagnetic material 99 upon being energized by electric current, and maintains mass of ferromagnetic material 99 in place within coil 101A as long as the current remains. When electromagnet 101 is deenergized, spring 98 returns rocker arm 89 to its normal position in which the change gear 22 engages and drives main register 23.

The rotation of worm 14 is transmitted through a reduction gearing 102, made up of worm wheel 19 and a reduction gear 102B, both of which are rigidly affixed to shaft 17. A gear 102A is driven by engagement with reduction gear 102B. Reduction gear 102B remains permanently meshed with gear 102A of change gear 22. The mounting of rocker arm 89 about shaft 17 maintains gear 102A, pivoted to rocker arm 89, permanently meshed with reduction gear 102B. Thus, change gear 22 is always driven by rotation of worm wheel 19 with appropriate change in speed afforded by reduction gearing 102.

An extension arm 103, rigidly affixed to rocker arm 89, includes an indicator end 104 in a visible region of dual rate watt-hour meter 10 to provide an external indication of the mode in use at any time. Indicator end 104 may be painted a highly visible color such as, for example, red. When in the solid-line position shown, indicator end 104 indicates that main register 23 is in use. When in the dashed-line position, indicator end 104 indicates that auxiliary register 93 is in use.

Referring now to FIG. 3, an electronic circuit is shown for controlling the mode of operation in response to a measured current, voltage, time of day or a combination of these parameters. Line terminals V1 and N1 are connected to a single phase supply line. Load terminals Vo and No are connected to a load (not shown). Terminals V1 and Vo are live, and terminal N1 and No are neutral or ground.

A current coil 106 is connected in series with the load between terminals V1 and Vo. A voltage coil 107 is connected in shunt between line terminals V1 and N1. Current coil 106 and voltage coil 107 are wound on respective magnetic cores 108 and 109 on opposite sides of sensor disk 13. A conventional compensating coil 111 is wound on magnetic core 108 of current coil 106, to compensate for phase error due to finite inductances of current coil 106 and magnetic core 108. Compensating coil 111 is connected to a special loop-type resistor 112. Resistor 112 is adjusted or trimmed during alignment of dual-rate watt-hour meter 10. A further feature of resistor 112 is detailed hereinafter. Besides its use in compensation, compensating coil 111 also serves to couple a sample of the current being consumed by the load into the following circuits.

The current sample from compensating coil 111 is applied through a level selector 113 to an amplifier 114. The current sample from compensating coil 111 is preferably about 20 mV in response to a load current of about 10 amperes.

Level selector 113 includes an array 116 consisting of six resistors 116A–116F. The values of resistors 116A–116F are selected so that jumpering appropriate ones thereof is effective to select one of the aforementioned current thresholds. Each one of resistors 116A-116F is associated with one or more pairs in a shorting terminal array 117. Shorting terminal pairs 117A-117F may be jumpered by any convenient means such as, for example, by placing a drop of solder bridging one or more of them across its respective resistor 116A-116F. Alternatively, instead of being positioned as shown for attenuating the input signal, level selector 113 may be relocated equivalently to adjust a reference voltage VR to a value which accomplishes the same threshold control.

Amplifier 114 includes an operational amplifier 118 connected as an inverter with a feedback resistor 119 connected from its output to its input thereof. The resistance of feedback resistor 119 fixes the gain of operational amplifier 118 at approximately 300. The output of operational amplifier 118 is connected to a variable resistor 121 in series with a negative temperature coefficient thermistor 122. Variable resistor 121 permits calibration of the mode threshold, and negative temperature coefficient thermistor 122 provides temperature compensation thereto. The AC signal from variable resistor 121 is half-wave rectified in half-wave rectifier 123 consisting of diodes 123A and 123B poled to apply only the positive half cycles of the signal to the inverting input of comparator 124. The non-inverting input of comparator 124 is connected through a resistor 125 to a reference voltage VR maintained at, for example, 2.4 volts.

A comparator 124 compares the level of the current signal to the threshold set by level selector 113. If the current signal exceeds the threshold, comparator 124 switches its output from positive to negative. The negative signal is fed through a logic diode 154A to a relay driver circuit 134. A feedback resistor 136 provides a hysteresis of, for example, approximately 5 percent to avoid chatter during operation.

Relay driver circuit 134 includes a voltage divider 138 for reducing the voltage of the active signal fed to the base electrode of an NPN transistor 139. NPN transistor 139 performs as a switch controlling the voltage fed to a gate electrode of a silicon controlled rectifier or thyristor 141. The control signal from NPN transistor 139 is filtered in a filter 142 to eliminate ripple and then fed through a Zener diode 143 for elevating the trigger threshold of silicon controlled rectifier or thyristor 141, in order to avoid accidental triggering.

When silicon controlled rectifier or thyristor 141 receives an active signal at its control electrode, it provides a closed circuit to energize electromagnet 101 to attract mass of ferromagnetic material 99 and to switch the transmission of the measured energy to be metered from main register 23 to auxiliary register 93 (FIGS. 1 and 2). A resistor 144 in series with electromagnet 101 from line terminal V1 limits the current energizing electromagnet 101 to about 30 mA.

The load current is sampled by compensating coil 111 which feeds an AC signal to level selector 113 and amplifier 114. Consequently, the output of comparator 124 provides positive pulsations of AC voltage having an amplitude proportional to the sampled current fed to comparator 124. Under normal conditions, the amplitude of the positive pulsations remains less than the reference voltage VR. Consequently, the output from comparator 124 normally remains positive. This positive signal passes through logic diode 154A to voltage divider 138 where it is attenuated before being fed to NPN transistor 139. The positive signal forward biases the base-emitter junction of NPN transistor 139, thereby saturating it and driving its collector to about zero volts. The zero volts at the gate electrode of silicon controlled rectifier or thyristor 141 is insufficient to enable conduction therethrough. Electromagnet 101 therefore remains deenergized and the energy consumed by the load is accumulated in main register 23 (FIG. 1).

When the consumption exceeds the threshold, the signal at the inverting input of comparator 124 exceeds reference voltage VR applied to its non-inverting input. This causes the output of comparator 124 to switch from positive to negative. As a result NPN transistor 139 is cut-off. A pull-up resistor 146 increases the voltage fed to filter 142 to a magnitude sufficient to trigger silicon controlled rectifier or thyristor 141 into conduction. Silicon controlled rectifier or thyristor 141 thereupon provides a path to ground for energizing electromagnet 101. This, in turn, attracts mass of ferromagnetic material 99 to electromagnet 101 and switches change gear 22 into engagement with gear 91A. As long as this condition remains unchanged, energy usage is accumulated in auxiliary register 93 (FIG. 1).

It is common practice for a utility to reduce the voltage supplied to its consumers during periods of high usage in order to reduce the network load. When a reduced-voltage condition exists, a consumer may draw excessive load current which exceeds the threshold value without, in fact, exceeding the threshold value of power usage. It would be unfair to penalize a consumer for high current consumption which results, not from his own intentional consumption, but instead, from an abnormally low voltage supplied by the utility. A low-voltage cutoff circuit 147 inactivates auxiliary register 93 if the line voltage falls below a predetermined voltage threshold. If the normal line voltage is 220 VAC, the predetermined voltage threshold may be, for example, about 200 VAC.

Low-voltage cutoff circuit 147 senses the supply voltage at line terminal V1 through a connection 148 feeding a voltage divider 149. The AC signal from voltage divider 149 is rectified in a half-wave rectifier 151 composed of diodes 151A and 151B poled to apply the positive half-cycles to a comparator 152. Reference voltage VR is fed to the non-inverting input of comparator 152. As long as the line voltage remains above the voltage threshold, comparator 152 applies a positive inhibit signal through a logic diode 154B to relay driver circuit 134. Relay driver circuit 134 is thereby inhibited from energizing electromagnet 101. Thus, the accumulation of energy usage in auxiliary register 93 is inhibited under a low-voltage condition.

Although the same reference voltage VR is used at the non-inverting inputs of comparator 124 and comparator 152 the effect of reference voltage VR is different in these two circuits. In comparator 124, reference voltage VR is a current threshold, whereas in comparator 152, reference voltage VR is a line voltage threshold. The use of the same reference voltage is purely for the sake of circuit simplification and should not be construed to have any other significance.

Logic diodes 154A and 154B provide logical ORing of the respective current and voltage signals at the input of relay driver circuit 134. Logic diodes 154A and 154B also provide isolation between the outputs of comparators 124 and 152 and apply a positive signal to the input of relay driver circuit 134 preventing energization of electromagnet 101 whenever at least one of the output signals from comparator 124 or comparator 152 is positive.

When connection 148 receives a voltage below the threshold voltage, comparator 152 applies a positive signal through logic diode 154B to inhibit Zener diode 143, thus preventing triggering of silicon controlled rectifier or thyristor 141 by a negative signal which may be produced at that time by comparator 124. A resistor 156 provides hysteresis to low-voltage cutoff circuit 147 to prevent chatter.

Referring now to FIG. 4, reference voltage VR is produced by a regulated supply which obtains its power from line terminals V1 and N1 at the input of dual rate watt-hour meter 10, to avoid charging the consumer for the power used by the electronic circuit. Line terminal V1 is connected through an impedance 126 to a surge protector 127 and a bridge rectifier 128. Surge protector 127, which may be, for example, a spark gap or a nonlinear resistor, absorbs high voltage spikes coming from the line. Preferably, impedance 126 is of the RL (inductance-resistance) type.

Bridge rectifier 128 is a full-wave rectifier. A capacitor 129 filters the ripple from the pulsating DC output of bridge rectifier 128 and a pair of Zener diodes 131A and 131B provide regulated DC voltage of two polarities V+, V− at 18 V and −18 V respectively with respect to ground VK. The voltages V+, V− feed the electronic circuit of FIG. 3 as indicated therein.

Reference voltage VR is derived from the positive voltage V+ by a resistor 132 and a Zener diode 133.

Referring again momentarily to FIG. 3, a set of external terminals A, C, K provide for externally modifying the operation of dual rate watt-hour meter 10. A clock-operated relay may be employed for directly controlling the transition between main register 23 and auxiliary register 93 (FIG. 1). Alternatively, a clock-operated relay may provide an economic incentive to consume a maximum amount of energy at certain hours and to limit the amount of energy usage at other hours.

Referring now to FIG. 5, there is shown a clock-operated relay which directly controls the recording of energy consumption in main register 23 and auxiliary register 93. Terminals K and C are permanently short-circuited to ignore the current-dependent output of the circuit of FIG. 3. During peak-hours, a clock 157 closes a pair of relay contacts 158A and 158K across terminals A and K to energize electromagnet 101 thus transfering energy registration in dual rate watt-hour meter 10 from main register 23 to auxiliary register 93.

Referring now to FIG. 6, a further clock-controlled embodiment of the invention is shown. Clock 157 controls the shorting of terminals K and C of the circuit of FIG. 3 by clock-controlled contacts 158C and 158K. When terminals K and C are shorted, the current-dependent output of the circuit of FIG. 3 is ignored. At other times, the current-dependent output of the electronic circuit of FIG. 3 is enabled to transfer energy recording to auxiliary register 93 whenever the predetermined current threshold is exceeded. The difference between the tariffs at different times may discourage overloading the generators beyond their nominal power output during peak hours and may encourage consumption outside the peak hours when the reduced system load makes such extra consumption welcome.

Referring again to FIG. 3, resistor 112 is preferably disposed on an elongated arc-shaped insulating board 159 to permit fitting resistor 112 within the conventional round cover (not shown) of a housing for dual rate watt-hour meter 10. Resistor 112 is preferably a printed circuit 161 having an appropriate resistivity. Board 159 describes approximately a 90-degree arc with a mean radius of approximately 55 mm (2⅛ inches) and a width of about 9 mm (⅜ inch). An edge 162 of board 159 includes connector points 163A and 163B for making connection to the ends of compensating coil 111.

Printed circuit 161 is made up of two parallel conductor lines 161A and 161B which extend from respective connector points 163A and 163B proximate edge 162 to an opposite edge 164 of board 159 where they may be connected together. A constant separation of about 0.5 mm (3/16 inch) is preferably maintained between conductor lines 161A and 161B.

The resistance of resistor 112 is adjusted by connecting a 100 percent inductive load across load terminals Vo and No, and shorting across conductor lines 161A and 161B to vary the resistance of resistor 112 until a position of the short circuit is found at which sensor disk 13 (FIG. 1) remains stationary. Once the correct value of resistance is established, the short circuit is replaced by a permanent short circuit using, for example, a drop of solder 166. This provides a simple and reliable method for calibrating dual rate watt-hour meter 10.

Having described preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. An electric meter comprising:
   a sensor disk;
   means for driving said sensor disk at a speed proportional to a current consumed by a load;
   a main register;
   an auxiliary register;
   means for sensing a voltage applied to said load;
   means for driveably connecting said sensor disk to said main register under a first condition of said voltage and current and for driveably connecting said sensor disk to said auxiliary register under a second different condition of said voltage and current whereby separate accumulation of energy usage is provided; said first condition including either one of said voltage and said current being less than first and second predetermined thresholds, respectively; and
   said second condition including both of said voltage and said current simultaneously exceeding said first and second predetermined thresholds, respectively.

2. An electric meter comprising:
   a sensor disk;
   means for driving said sensor disk at a speed proportional to a current consumed by a load;
   a main register;
   an auxiliary register;
   means for sensing a voltage applied to said load;
   means for sensing a current consumed by said load;
   means for driveably connecting said sensor disk to said main register under a first condition of said voltage and current and for driveably connecting said sensor disk to said auxiliary register under a second different condition of said voltage and current whereby separate accumulation of energy usage is provided;

said means for sensing a current including a compensating coil effective for producing a current signal proportional to said current consumed by said load;

a resistor connected across said compensating coil and effective for producing a voltage proportional to said current signal;

said compensating coil and said resistor having a characteristic effective for at least partly compensating for an impedance of said load; and said current signal being employed by said means for driveably connecting to sense at least one of said first and second conditions of said current.

3. An electric meter according to claim 2 wherein:

said first condition includes either one of said voltage and said current being less than first and second predetermined thresholds, respectively; and said second condition includes both of said voltage and said current simultaneously exceeding said first and second predetermined thresholds, respectively.

* * * * *